United States Patent [19]
Nelson et al.

[11] Patent Number: 6,130,575
[45] Date of Patent: *Oct. 10, 2000

[54] HIGH-SPEED SWITCHING REGULATOR DRIVE CIRCUIT

[75] Inventors: Carl T. Nelson, San Jose; Robert Essaff, Fremont, both of Calif.

[73] Assignee: Linear Technology Corp., Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/153,108

[22] Filed: Sep. 15, 1998

Related U.S. Application Data

[63] Continuation of application No. 08/939,310, Sep. 29, 1997, Pat. No. 5,815,015, which is a continuation of application No. 08/228,478, Apr. 15, 1994, Pat. No. 5,672,988, and a division of application No. 08/472,538, Jun. 7, 1995, Pat. No. 5,589,761.

[51] Int. Cl.$^7$ ........................................................ G05F 3/02
[52] U.S. Cl. ............................................................. 327/540
[58] Field of Search .................................... 323/282, 284, 323/285; 327/77, 84, 85, 87, 88, 89, 561, 562, 563

[56] References Cited

U.S. PATENT DOCUMENTS

| | | | |
|---|---|---|---|
| 2,895,100 | 7/1959 | Filberich et al. | 321/11 |
| 3,418,495 | 12/1968 | Bose | 307/239 |

(List continued on next page.)

OTHER PUBLICATIONS

D.L. Grundy et al. (Ferrant Ltd.), "Collector diffusion isolation packs many functions on a chip," *Electronics*, v. 45, No. 14, pp. 96–104, Jul. 3, 1972.

Bob Mammano, "Simplifying Converter Design with a New Integrated Regulating Pulse Width Modulator," vol. III of the Proceedings of Powercon 3: Third National Solid–State Power Conversion Conference, Jun. 1976.

"LT1070 Design Manual," *Linear Technology Application Note 19*, by C. Nelson, Linear Technology Corporation, Milpitas, California, Jun. 1986, pp. 1–76.

(List continued on next page.)

*Primary Examiner*—Jeffrey Zweizig
*Attorney, Agent, or Firm*—Fish & Neave; Robert W. Morris; Joel Weiss

[57] ABSTRACT

A drive circuit for a high-speed integrated circuit, bipolar switching regulator is disclosed. The circuit runs at megahertz frequencies, yet is efficient as previously available bipolar integrated circuit switching regulators operating at much lower frequencies. The circuitry provides three switch drive currents: a first (nominal) current that is provided while the switch is off in order to conserve power; a second (boosted) current, provided while the switch is transitioning from off to on in order to increase the speed at which the switching element switches on; and a third (drive) current, provided after the switch has turned on for maintaining the switch at a desired point in saturation. The drive current, additionally, varies as a function of the load on the switch in order, again, to conserve power. Additional circuitry increases the speed at which the switch turns off, by momentarily boosting base discharge current during the on-to-off transition period of the switch. The circuitry also increases speed by enabling the drive current prior to switch turn on. The circuitry can regulate both positive and negative outputs using a common error amplifier, as well as providing a multifunction node for shutdown and synchronization. Additionally, the circuitry provides improved recovery from output overshoot conditions. An improved clamp, to prevent the switch from spending too much time in a high power state (which would slow the switch down), increases the stability of the switch as compared with previously known designs.

3 Claims, 11 Drawing Sheets

U.S. PATENT DOCUMENTS

| | | | |
|---|---|---|---|
| 4,047,055 | 9/1977 | Romano | 307/262 |
| 4,227,988 | 10/1980 | Galwey et al. | 204/231 |
| 4,288,738 | 9/1981 | Rogers et al. | 323/271 |
| 4,331,886 | 5/1982 | Perner et al. | 307/270 |
| 4,331,887 | 5/1982 | Jadus et al. | 307/270 |
| 4,337,465 | 6/1982 | Spracklen et al. | 340/825.03 |
| 4,355,403 | 10/1982 | Spaniol et al. | 375/36 |
| 4,360,744 | 11/1982 | Taylor | 307/254 |
| 4,394,587 | 7/1983 | McKenzie et al. | 307/355 |
| 4,538,078 | 8/1985 | Pfeifer | 307/592 |
| 4,677,324 | 6/1987 | Ronan Jr. et al. | 307/571 |
| 4,688,157 | 8/1987 | Rischmuller | 363/20 |
| 4,755,741 | 7/1988 | Nelson | 323/289 |
| 4,823,070 | 4/1989 | Nelson | 323/285 |
| 4,947,055 | 8/1990 | Shekhawat et al. | 307/254 |
| 4,947,309 | 8/1990 | Jonsson | 363/17 |
| 5,111,133 | 5/1992 | Poulo et al. | 323/286 |
| 5,138,202 | 8/1992 | Shekhawat et al. | 307/570 |
| 5,218,243 | 6/1993 | Keown et al. | 307/446 |
| 5,294,928 | 3/1994 | Cooper et al. | 341/142 |
| 5,361,008 | 11/1994 | Saijo | 327/427 |
| 5,408,136 | 4/1995 | Ovens et al. | 327/108 |
| 5,410,189 | 4/1995 | Nguyen | 327/374 |
| 5,422,562 | 6/1995 | Mammano et al. | 323/282 |
| 5,477,132 | 12/1995 | Canter et al. | 323/282 |
| 5,576,648 | 11/1996 | Rossi et al. | 327/110 |

OTHER PUBLICATIONS

"LT1070/LT1071: 5A and 2.5A High Efficiency Switching Regulators," *Linear Technology Data Sheet*, Linear Technology Corporation, Milpitas, California, Apr. 1989, pp. 1–12.

"LT1074/LT1076: Step–Down Switching Regulator," *Linear Technology Data Sheet*, Linear Technology Corporation, Milpitas, California, Jun. 1991, pp. 1–16.

"LT1074/LT1076 Design Manual," *Linear Technology Application Note 44*, by C. Nelson, Linear Technology Corporation, Milpitas, California, Sep. 1991, pp. 1–48.

HIGH-SPEED SWITCHING REGULATOR DRIVE CIRCUIT

This application is a continuation of U.S. patent application Ser. No. 08/939,310, filed Sep. 29, 1997, (which issued as U.S. Pat. No. 5,815,015 on Sep. 29, 1998), which is a continuation of U.S. patent application Ser. No. 08/228,478, filed Apr. 15, 1994, (which issued as U.S. Pat. No. 5,672,988 on Sep. 30, 1997); and also is a division of U.S. patent application Ser. No. 08/472,538, filed Jun. 7, 1995, (which issued as U.S. Pat. No. 5,589,761 on Dec. 31, 1996).

The present invention relates to a circuit and method for providing a high-speed switching regulator. More particularly, the invention relates to circuit and method that provides a high-speed, bipolar integrated circuit switching regulator that can switch at megahertz frequencies, yet operates at efficiencies comparable to or better than previously available bipolar switching regulators operating at much slower speeds.

BACKGROUND OF THE INVENTION

With battery powered portable computers on the rise, the demand for efficient DC-to-DC power conversion is increasing. Battery life is of paramount importance to portable systems. Other important considerations are reducing space, weight and cost.

Switching regulators have long been known as offering a means for converting battery voltage in portable systems to other voltages at high efficiencies. However, a problem with previously available bipolar integrated circuit regulators has been that the switch operates at relatively low frequencies (e.g., in the neighborhood of 100 kHz). These low frequencies, while enabling the circuitry to operate with reasonable efficiency, require the use of relatively large external inductors and other components to form the switching regulator. Previously available high-speed, bipolar switching regulators that use smaller external components have suffered from a problem of inefficiency, and thus consume too much battery power.

In view of the foregoing, it would be desirable to provide an improved integrated circuit, bipolar switching regulator that operates at high-frequencies, in order to reduce the space, weight and cost of external inductors and other components used with the regulator.

It would further be desirable to provide such an integrated circuit switching regulator that operates at high efficiency, in order to prolong battery life in portable systems.

SUMMARY OF THE INVENTION

In view of the foregoing, it is an object of the present invention to provide an improved integrated circuit, bipolar switching regulator that operates at high-frequencies, in order to reduce the space, weight and cost of external inductors and other components used with the regulator.

It is a further object of the present invention to provide such an integrated circuit switching regulator that operates at high efficiency, in order to prolong battery life in portable systems.

These, and other objects of the present invention, are accomplished by an improved integrated circuit, bipolar switching regulator circuit. The circuit can operate in the megahertz range, yet at efficiencies comparable to or better than switching regulators heretofore available that operated at much lower frequencies. The circuit provides three switch drive currents: a first (nominal) continuous current, kept low or at zero in order to conserve power; a second (boosted) current provided while the switch is transitioning from off to on in order to increase the speed at which the switching element turns on; and a third (drive) current provided after the switch has turned on to maintain the switch at a desired point in saturation. Also to conserve power, the drive and or boost currents vary as a function of the load on the switch. Additional circuitry momentarily boosts the base discharge current of the switch while the switch is transitioning from on to off, in order to increase the speed at which the switch turns off in an efficient, power-conserving manner.

The circuits of the present invention further increases the speed at which the switch can transition by enabling the drive current prior to turning on the switch (so that when the switch is turned on, its drive current has already ramped up). Additional circuitry is provided by the present invention to enable the regulator to regulate dual polarity outputs (either positive or negative) using a common error amplifier (to reduce component count and circuit complexity). The circuitry also provides a multifunction node which can be used to shut down the regulator or synchronize the regulator. Further circuitry is provided for improving the recovery from output overshoot conditions. Finally, an improved clamp that prevents the switch from operating too far in saturation (which would slow the switch down and reduce efficiency) increases the stability of the anti-saturation loop as compared with previously known designs.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
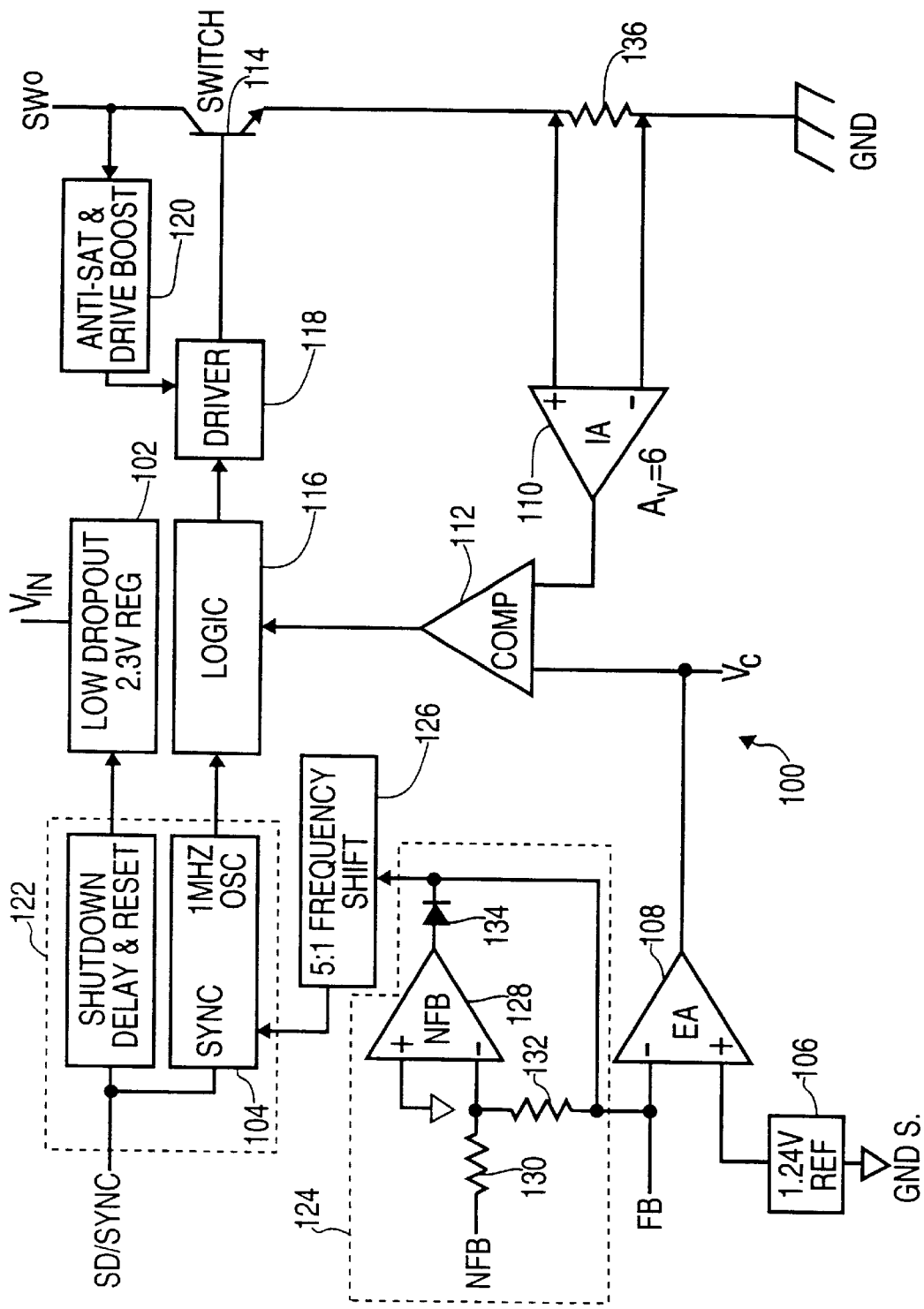
FIG. 1 is a schematic block diagram of a current mode switching regulator incorporating principles of the present invention.

FIG. 1 shows a schematic block diagram of a current mode switching regulator which incorporates the principles of the present invention. Although the principles of the invention are described with respect to a current mode regulator, it will be apparent to persons skilled in the art that many of the principles described below are equally applicable to other regulator circuits.

Switching regulator 100 may include a low dropout regulator 102, a trimmed oscillator 104, a trimmed reference voltage 106, an error amplifier 108, a current amplifier 110, a current comparator 112 to drive a switch 114. As is described below, in accordance with the principles of the present invention, regulator 100 also may include logic circuitry 116 and driver circuitry 118 to drive switch 114, as well as drive boost circuitry 120. Additionally, regulator 100 may include combined shutdown and synchronization circuitry 12, which utilizes a single input pin, a negative feedback regulation network 124 and an oscillator frequency shifting network 126. As described in more detail in FIG. 9, negative feedback network 124 may include a feedback amplifier 128, resistor 130 and 132, and a means of blocking the output of the amplifier when its output goes low, shown in FIG. 1 as a simple diode 134. Current amplifier 110 measures the current passing through switch 114 by using a low value resistor 136 (e.g., 0.1 ohms). The function of nodes SD/SYNC, NFB, FB, $V_C$, SWO and $V_{IN}$ will also be apparent from the detailed discussion below.

Figure 2:
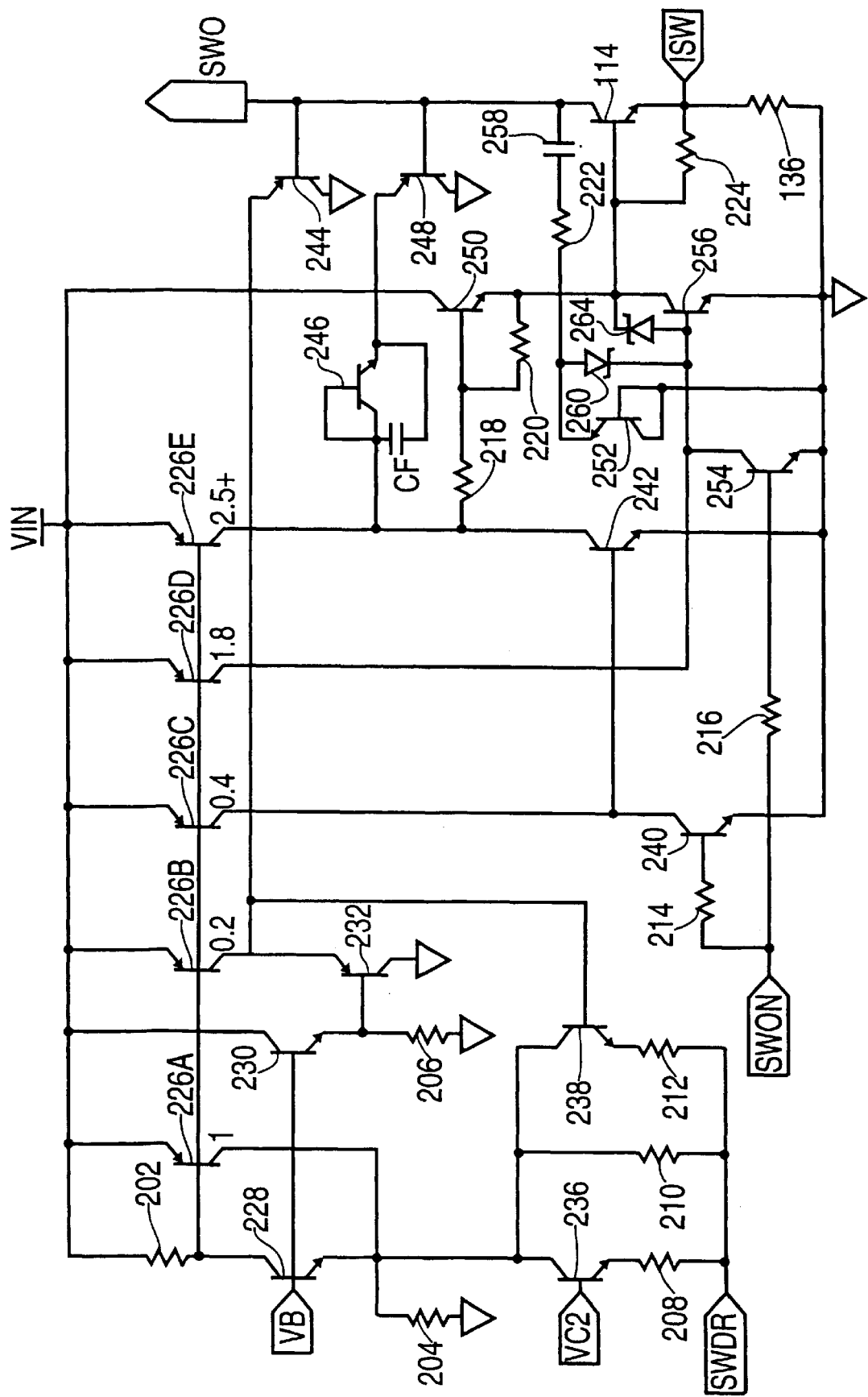
FIG. 2 is a schematic diagram of an exemplary embodiment of an integrated circuit switching regulator incorporating principles of the present invention.

FIG. 2 shows a detailed schematic diagram of an exemplary embodiment of the driver portion of an integrated circuit switching regulator incorporating principles of the present invention. The circuit is designed for coupling to a source of DC input voltage applied across terminals $V_{IN}$ and GND.

In the circuit of FIG. 2, the switch is comprised of power NPN transistor 114. Drive current for the switch is provided by PNP transistor 226E in combination with transistor 250. Terminal SWO is the switch output terminal for connection to an external load (not shown) that, in turn, is coupled to a source of electrical potential. This external load typically would include one or more current-steering diodes, an inductive element, and other components arranged in conventional fashion (e.g., in buck, flyback or boost configurations) to implement a complete switching regulator. Terminal ISW is a node where measurements of the current passing through switch 114 may be made (by using resistor 136). For example, when the circuit shown in FIG. 2 is used in a current mode switching regulator, the voltage across resistor 136 is used to determine when to shut off switch 114. The measured voltage is compared to a reference voltage which is set to represent the current shut-off point. When the measured voltage exceeds the reference voltage, the current trip point has been reached and switch 114 is shut-off (when the circuit has been shut down or a high impedance condition exists, resistor 224 prevents excess leakage current from inadvertently turning on switch 114).

Switch 114 is turned on and off by a signal, SWON ("SWitch ON"), via NPN transistors 240, 242, 254 and 256. When SWON is de-asserted (i.e., it is low), transistors 240 and 254 are off. This allows current provided by the collectors of PNP transistors 226C and 226D to drive the bases of transistors 242 and 256, turning those transistors on. (As further discussed below, transistors 226A–E form a controllable current source. Although shown as five separate transistors, persons skilled in the art will recognize that transistors 226A–E may be implemented instead, as in an actual embodiment of the circuit, as a single transistor 226 having multiple collectors A–E. In either case, transistor 226 is kept off during shutdown or high impedance conditions by resistor 202 which is connected to its base.) When transistor 242 is on, the base of transistor 250 is pulled low to turn that transistor off (transistor 250 is kept off by resistor 220). This prevents base drive from reaching transistor 114, and so the switch is off. As further discussed below, transistor 256 helps to turn and maintain switch 114 off (and diode 264 is used to increase the turn off speed of transistor 256).

When signal SWON is asserted high, the opposite occurs. Transistors 240 and 254 are turned on, causing the currents provided by the collectors of transistors 226C and 226D to be shunted to ground. The bases of transistors 240 and 254 are connected to ballast resistors 214 and 216, respectively, to prevent one saturated transistor from driving the other into saturation. Transistors 242 and 256, accordingly, are turned off. As a result, collector current from transistor 226E drives the base of transistor 250 through resistor 218 to turn that transistor on. Transistor 250 and PNP transistor 226E thus drive the base of switch 114 to turn the switch on.

The amount of current required from transistor 226E depends on whether switch 114 is conducting a large or small current. When the load on switch 114 is high, transistor 226E should preferably supply a relatively large current sufficient to cause the switch to turn on and to be driven to a desired operating point. The precise amount of drive current required to accomplish this will vary depending on the load on switch 114. Too much drive current is a waste of power and reduces efficiency. Too little drive current prevents the switch from turning on completely and would leave the switch in an undesirable high power dissipation state. When switch 114 is off, on the other hand, transistor 226E preferably should provide only a nominal or zero current.

In view of the foregoing, and in accordance with an aspect of the present invention, the circuit of FIG. 2 thus includes circuitry for reducing switch drive current during periods of time that switch 114 is off. This circuitry includes transistors 236, 238 and 228 as well as resistors 208, 210, 212 and 204, operating in conjunction with signal SWDR. The circuitry operates as follows.

When switch 114 is off (i.e., when signal SWON is low), signal SWDR ("SWitch DRive") is high. Thus, no current flows through transistor 236, resistor 210 or transistor 238. To keep the PNP current source circuitry of transistors 226A–E biased, resistor 204 provides a path for a nominal current to flow through current-setting transistor 226A. NPN transistor 228, driven by reference voltage $V_B$ (which, in the exemplary circuit of FIG. 2, is preferably 2.2 volts), drives the base of transistor 226A until transistor 226A's collector current is sufficient to support the load (resistor 204) on transistor 226A's collector. Reference voltage $V_B$ may be generated by circuitry, not shown, in any of a number of conventional ways that will be readily apparent to those skilled in the art. For example, a bandgap reference circuit may be connected to an amplifier to adjust the bandgap reference voltage $V_{BG}$ (typically 1.24 volts) to the desired reference voltage (e.g., 2.2 volts). The voltage at the collector of transistor 226A thus is equal to the magnitude of $V_B$ (2.2 volts) minus the base-emitter voltage of transistor 228 (about 0.7 volts). The setting by resistor 204 of transistor 226A's nominal current sets the nominal currents provided by transistors 226B–E. This is because the collector currents of transistors 226B–E are related to the collector current of transistor 226A by the ratios of the areas of the transistors.

As indicated in the exemplary circuit of FIG. 2, the ratios of the currents A:B:C:D:E of transistors 226A–E are 1×: 0.2×: 0.4×: 1.6×: 5×, respectively.

Figure 3:
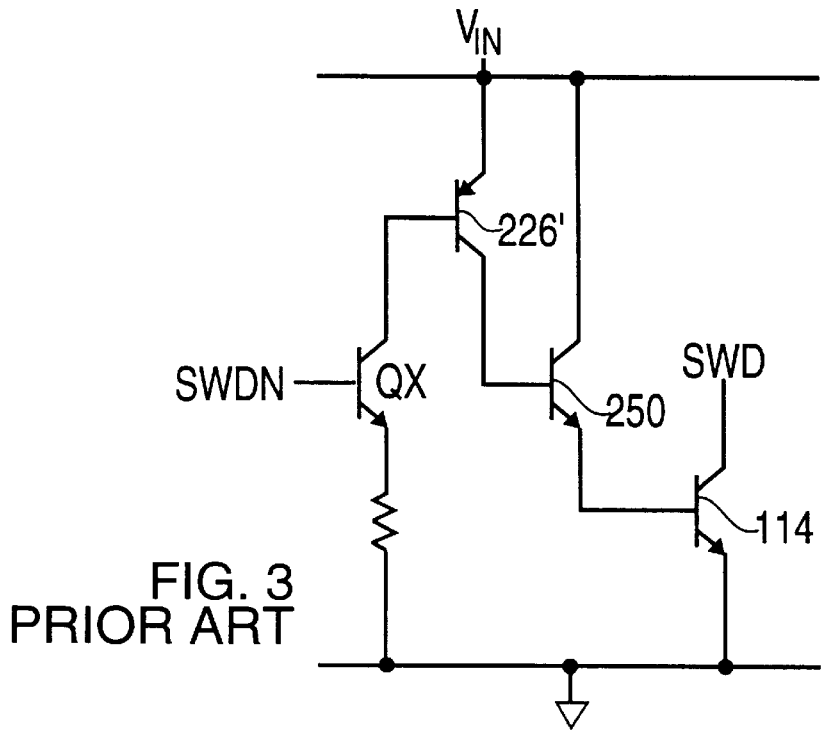
FIG. 3 is a simplified schematic diagram of a prior art circuit configuration for reducing switch drive current during switch off times.

One known way in which switch drive current can be reduced during switch off time is shown in FIG. 3. In this configuration, the circuit of FIG. 1 has been modified so that driver transistor 226' is now part of the SWON signal path via NPN transistor $Q_X$ (one circuit with such a configuration is shown in LT1074/1076 Step-Down Switching Regulator," 1992 *Linear Databook Supplement*, Linear Technology Corporation, pp.4–19 to 4–207 (1992)). In this circuit, when signal SWON is low, switch driver 226' is off. Thus, no drive current is provided to switch 114. This circuit is less desirable than the implementation of FIG. 2, however, because bipolar integrated circuit PNP transistors are slow. Particularly in high speed switching regulator circuits, where the switching element operates in the megahertz range, the length of time it takes transistor 226' to turn on would cause the switch to turn on too slowly. This would result in the switch having poor AC turn-on characteristics, a situation that would waste power in the switch.

One problem that can occur when drive current to a switch is reduced during the switch's off time, as described above, is that the amount of time needed to turn the switch back on is increased. This is because it takes time for the drive current to ramp up, which causes the switch itself to turn on more slowly than it otherwise would (because the speed at which a transistor switches is related to the magnitude of its drive). To solve this problem, another aspect of the present invention provides circuitry that enables the base drive current for the switch prior to when the switch itself is turned on. Pre-enabling the switch's base drive allows the drive current to increase to the proper magnitude before being applied to the switch. Because the speed at which switch 114 turns on is related to the magnitude of its drive current, pre-enabling the drive current results in the switch turning on more quickly than it otherwise would.

Figure 4:
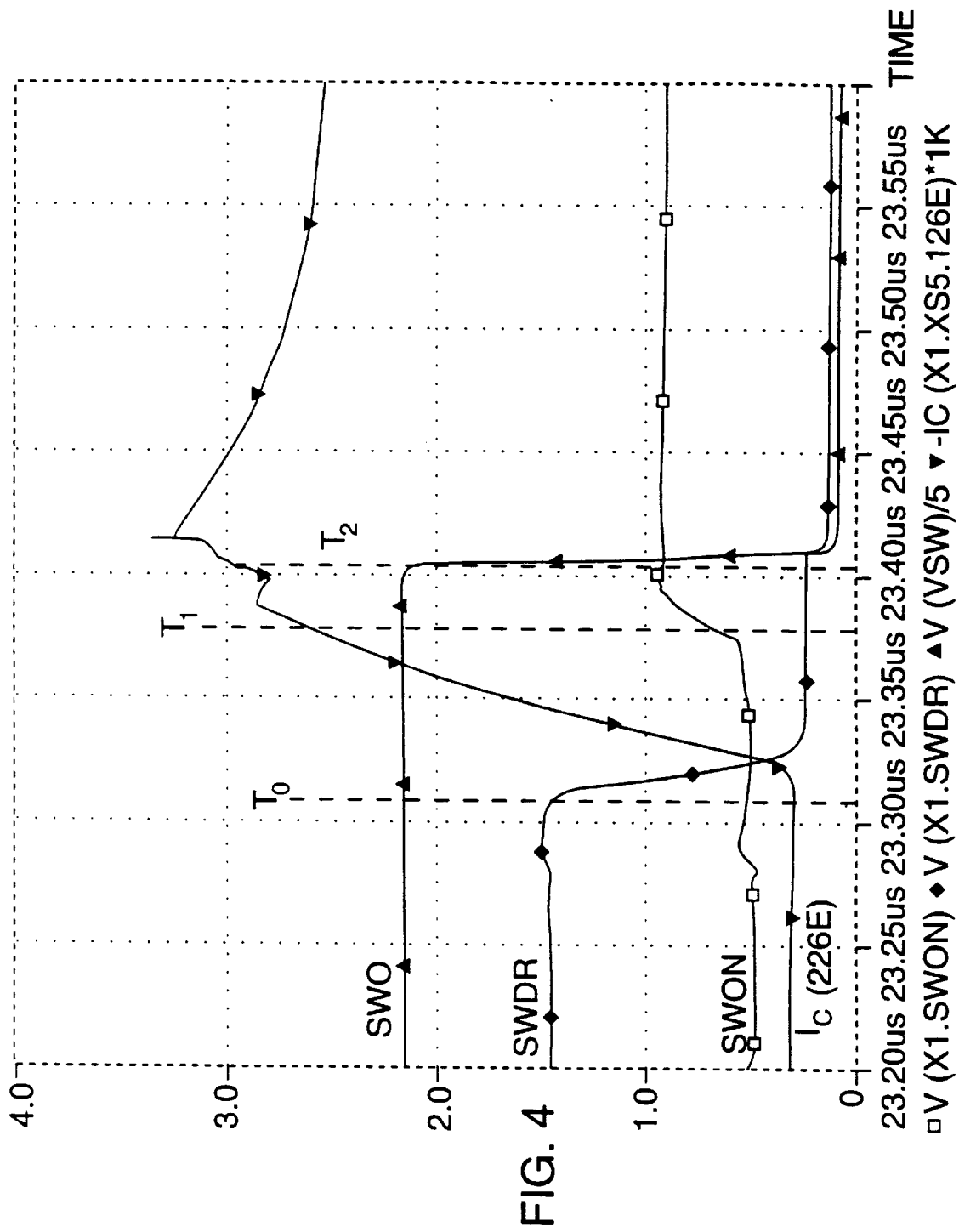
FIG. 4 is a graph showing switch driver currents as a function of time for the circuit of FIG. 2.

The drive current for switch 114 is turned on in advance of the switch by the timing of signals SWDR and SWON. FIG. 4 is a graph depicting the timing relationship of signals SWDR and SWON, the switching of transistor 114 (shown by the trace for terminal SWO), and the drive current provided by transistor 226E. In FIG. 4, signal SWDR goes low at time $T_0$. This enables (turns on) the switch drive current provided by transistor 226E, which ramps up as shown by the trace $I_{C(226E)}$. Between times $T_0$ and $T_1$, the switch drive current is allowed to rise. At time $T_1$, when the drive current provided by transistor 226 has reached a desired magnitude, signal SWON goes high to turn on switch 114. Switch 114 turns on at time $T_2$, as indicated by the falling trace (SWO) of the switch's collector voltage.

Figure 6:
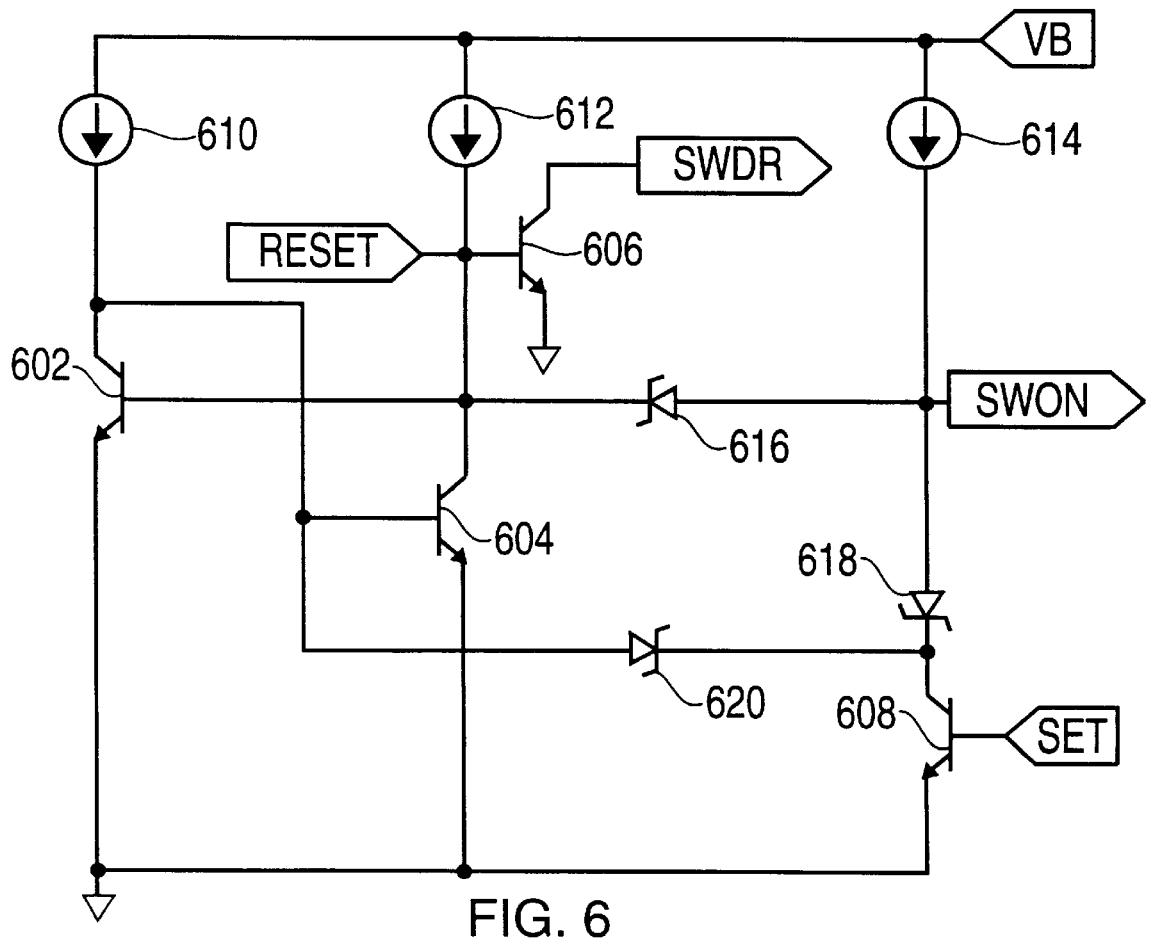
FIG. 6 is a schematic diagram of an exemplary logic circuit for generating control signals used by the circuit of FIG. 2.
Figure 5:
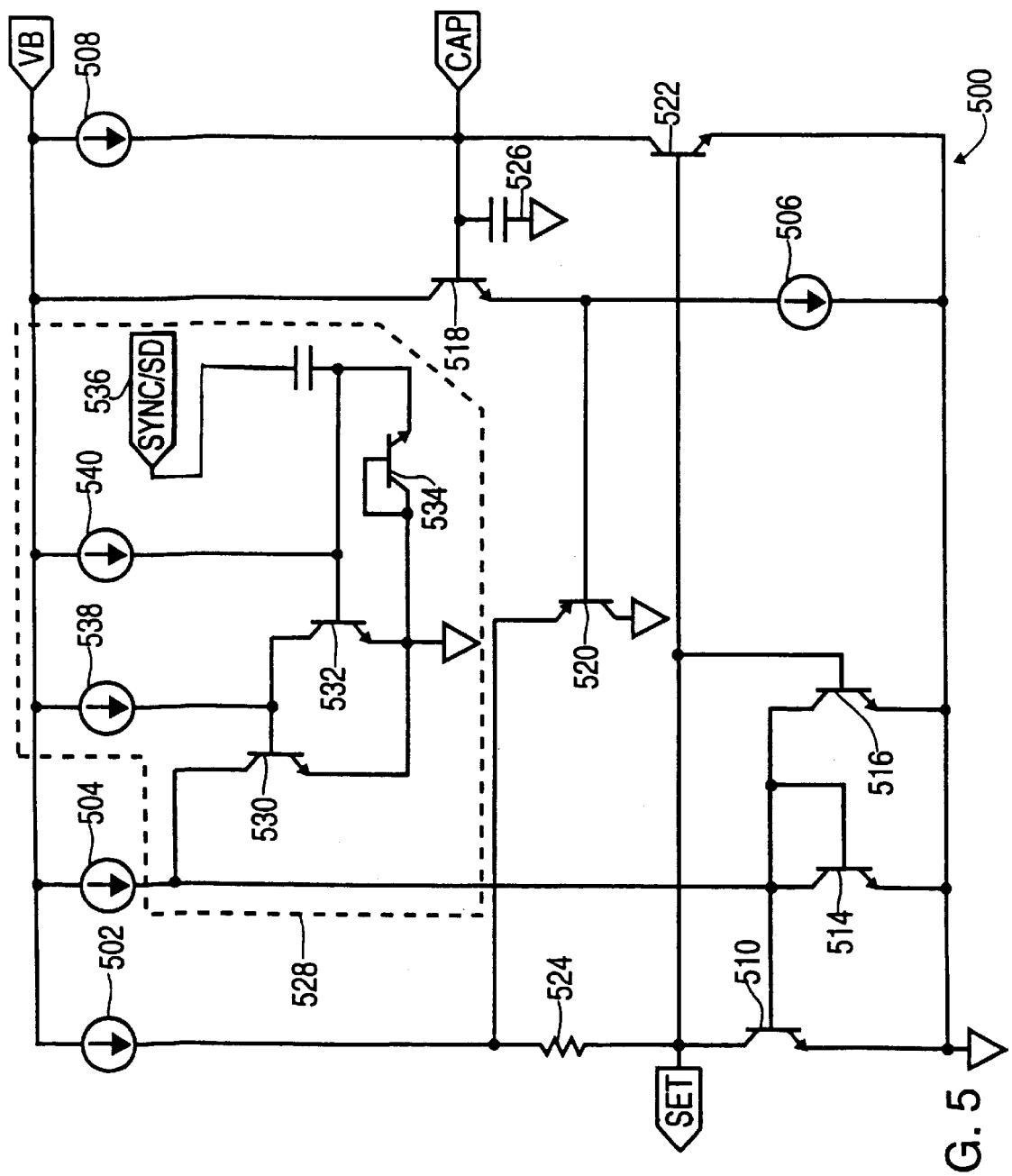
FIG. 5 is a schematic diagram of an exemplary embodiment of an oscillator for generating timing signals for the circuit of FIG. 2.

FIGS. 5 and 6 show exemplary circuits for generating signals SWON and SWDR in proper timing relationship to one another. The manner in which these circuits operate may be understood by reference to the timing chart of FIG. 7.

Figure 7:
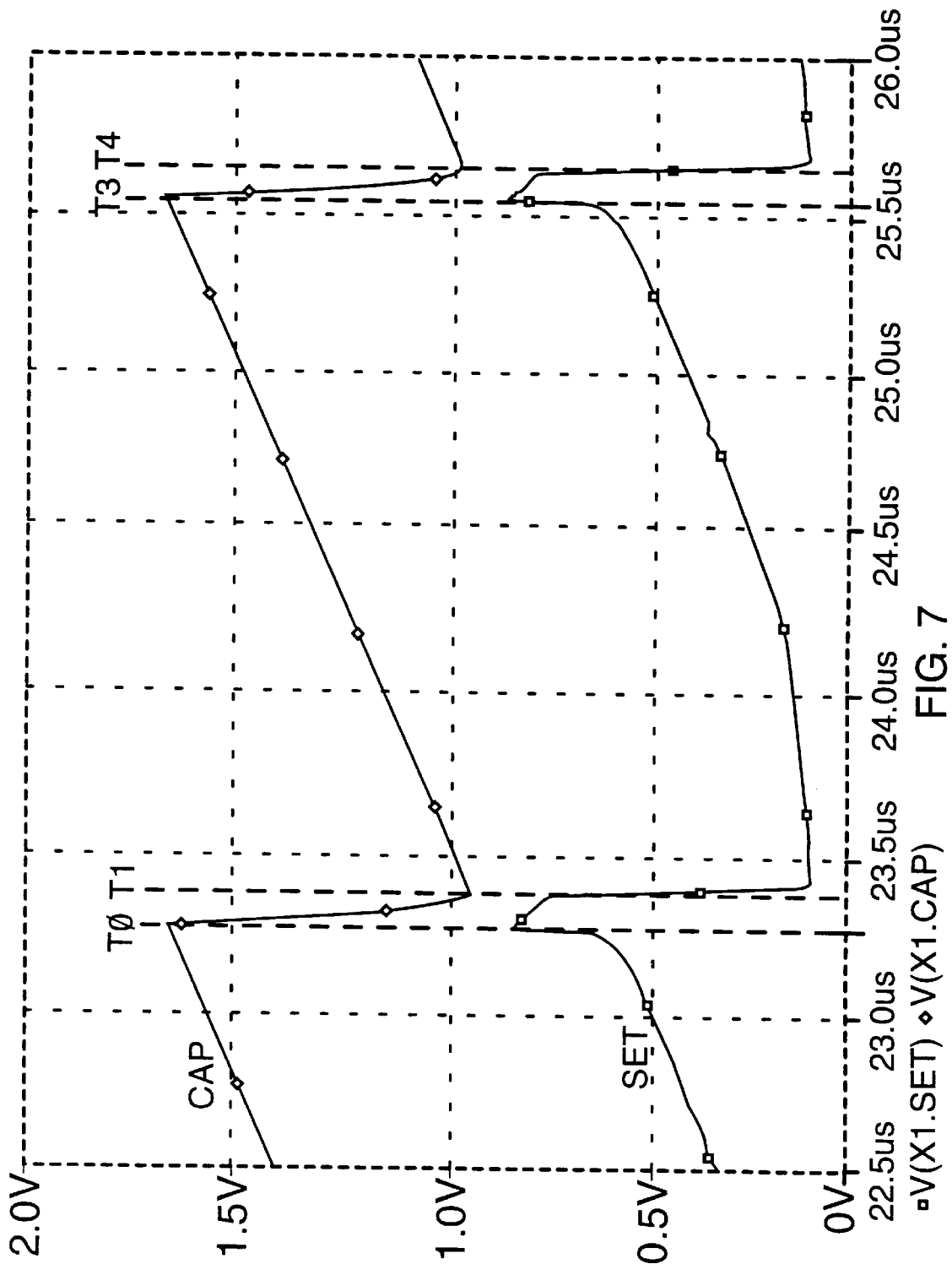
FIG. 7 is a graph showing outputs produced by the oscillator circuit of FIG. 5.

FIG. 5 depicts a simplified schematic of the regulator's oscillator circuitry 500, the output of which is a sawtooth (as shown in FIG. 7) having a rise time that is much slower than its fall time. The trace labelled "CAP" in FIG. 7 shows the oscillator's sawtooth waveform at the output node labelled "CAP" (FIG. 5), while trace "SET" in FIG. 7 is the oscillator's waveform at the node in FIG. 5 labelled "SET." An oscillator cycle in FIG. 7 begins at time $T_0$, when the oscillator's output begins to fall. It is easier to understand how the oscillator works, however, by starting the analysis at time $T_1$ when the oscillator's output begins to rise. NPN transistors 510 and 514 form a current comparator, which compares the collector current of transistor 510 (current from first current source 502 ($I_1$) passing through resistor 524) to a second reference current source 504 ($I_2$). At time $T_1$, transistor 510's collector current is below $I_2$, causing transistor 510 to pull the SET node low. This turns off transistors 516 and 522. With transistor 522 off, capacitor 526 is charged by current source 508 ($I_4$). This causes the capacitor's voltage to linearly increase, as shown in FIG. 7 by the trace labelled CAP between times $T_1$ and $T_3$. This voltage at the CAP node is transferred to the emitter of transistor 520 by transistor 518 (which is kept biased by current source 506 ($I_3$)). Together, transistors 518 and 520 form a unity-gain buffer. As the voltage on transistor 520's emitter rises, the current through resistor 524 and transistor 510 rises. The CAP voltage continues to rise until time $T_3$, when transistor 510's collector current exceeds that of reference current $I_2$ and the voltage on transistor 510's collector is sufficient to turn on transistor 516. When this occurs, the voltage at the SET terminal goes high. This turns on transistors 516 and 522, and marks the start of the oscillator's fall time.

When transistor 516 turns on at time $T_3$, it disables the current comparator formed by transistors 510 and 514 by shunting to ground reference current $I_2$. At the same time, transistor 522 discharges capacitor 526, causing the voltages across capacitor 526 and at the emitter of transistor 520 to fall rapidly (see the CAP trace in FIG. 7, between times $T_3$ and $T_4$). This continues until time $T_4$ is reached, where the voltage on transistor 520's emitter is no longer sufficient to keep transistors 516 and 522 turned on. When this occurs, transistors 516 and 522 turn off. Transistor 516 thus releases the current comparator, and the SET terminal goes low again to begin another cycle.

The SET signal produced by oscillator 500 is used by the logic circuitry of FIG. 6 to generate signals SWON and SWDR. Switch drive current is enabled at the beginning of oscillator fall time (i.e., at time mark $T_0$ in FIG. 7; see also FIG. 4). The "dead zone" between times $T_0$ and $T_1$ in FIG. 7, when the oscillator's sawtooth is falling, provides a fixed delay to the point in time (at $T_1$) when the switch is turned on (see FIG. 4). In FIG. 6, transistors 602 and 604 (which get bias current from current sources 610 ($I_1$) and 612 ($I_2$), respectively) form a set/reset flip-flop. Prior to time $T_0$, the flip-flop is reset by assertion of a RESET signal. (The RESET signal is generated when the switch current exceeds the current trip point described above for a current mode regulator.) When the RESET signal is asserted momentarily low, transistor 606 is turned off to cause signal SWDR to go high, transistor 602 is turned off and the SWON signal is pulled low (through diode 616). This causes the flip-flop to switch to its reset state (with transistor 602 off and transistor 604 on). At time $T_0$, the SET signal from oscillator 500 is asserted high (see FIG. 7). This turns on transistor 608, which forces its collector low to turn off transistor 604 via diode 620. The collector of transistor 604 resultantly goes high, and the flip-flop thus is "set" (transistor 602 is on and transistor 604 is off). This causes transistor 606 to turn on (because current source 612 drives transistor 606's base), and so the collector of transistor 606 goes low—which asserts the SWDR signal low (as earlier described). Transistor 608 also holds signal SWON low via diode 618, so that signal is not asserted at this time. At time $T_1$, however, the SET signal goes low (see FIG. 7). This turns off transistor 608, causing its collector to go high to assert signal SWON (which gets its bias current from current source 614 ($I_3$)). Thus, the circuitry of FIGS. 5 and 6 turns on the drive current for the switch before the switch itself is turned on.

The foregoing pre-enabling of the switch drive current enhances the speed at which the switch transitions from off to on because, as mentioned, the speed at which a transistor switches on is related to its drive current. As the drive current increases, the speed of switching increases. However, if the drive current is too large efficiency will decrease. To increase the speed of switching of transistor 114 without unnecessarily impacting on the efficiency of the circuit, and in accordance with still another aspect of the present invention, the circuit of FIG. 2 includes circuitry to cause the drive current to the switch to be varied as a function of the amount of drive the switch needs. In addition, the circuitry momentarily boosts the drive current provided to the switch while the switch is turning on in order to increase the speed at which this switching occurs. After the switch has turned on, and while the switch remains on, its drive current is reduced to a level that varies as a function of the load on the switch. This circuitry operates as follows.

Referring again to FIG. 2, and as earlier discussed, signal SWDR is de-asserted (i.e., it is high) while switch 114 is off. Under this condition, transistor 226E produces a nominal (or zero) first current set by the value of resistor 204. When signal SWDR signal goes low to turn on the switch drive current, however, the load placed on the collector of transistor 226A increases to become the sum of the currents flowing through resistors 204 and 210, plus the collector currents of transistors 236 and 238. This causes transistor 226E to produce a second (boosted) current calculated to turn the switch on very rapidly.

Transistor 236 turns on, when signal SWDR goes low, because its base is driven by voltage $V_{C2}$. This voltage is an internally buffered version of the voltage $V_C$ which represents the desired switch current trip point. As previously described, this voltage varies as the load on switch 114 varies. Because the voltage of the current trip point ($V_C$) is closely related to the current through switch 114, transistor 236's collector current thus will follow the switch current. Therefore, the amount of drive switch 114 receives from transistor 226E will depend on the switch's load current. This results in delivering to the switch only as much drive current as the switch requires, and conserves power.

Also when SWDR is asserted transistor 238 is turned on. However, unlike transistor 236 (which stays on as long as switch 114 is on), transistor 238 stays on substantially only during the period of time that switch 114 is transitioning from off to on. Transistor 238 thus causes transistor 226E to provide a boosted drive current to switch 114 for a momentary duration only when it is needed—namely, when the switch is turning on in order to increase its switching speed. Transistor 238 turns on momentarily in this fashion when signal SWDR goes low because the base of transistor 238 is driven by transistor 232 and a small bias current from transistor 226B, which clamps transistor 238's base to the reference voltage $V_B$. (A unity gain buffer formed by transistors 230 and 232 isolates $V_B$ from the base of transistor 238. The bias for transistor 230 is set by resistor 206.) Thus, when SWDR goes low, transistor 238 turns on. While transistor 114 is off, transistor 244 is also off (because terminal SWO, when coupled to a load, is high). However, when switch 114 turns on its collector voltage drops. This turns transistor 244 on, which pulls down on the base of transistor 238 to turn it off. With transistor 238 off, the load on transistor 226A is reduced and the boosting of the switch's drive current ceases. The current provided by transistor 226E is thus reduced to a level determined by the current flowing through resistor 204, transistor 236 and resistor 210.

The driver circuitry of FIG. 2, described above, accordingly provides three different and independent currents: a first (nominal) current provided while the switch is off in order to conserve power; a second (drive) current provided while the switch is on to drive the switch to a desired operating point, as a function of the switch's load current, and a third (boosted drive) current provided substantially only while the switch is in the process of turning on in order to increase the speed with which that transition occurs. By virtue of this tri-state drive circuitry, switching speeds are increased with an actual reduction in the amount of power consumed.

Figure 8:
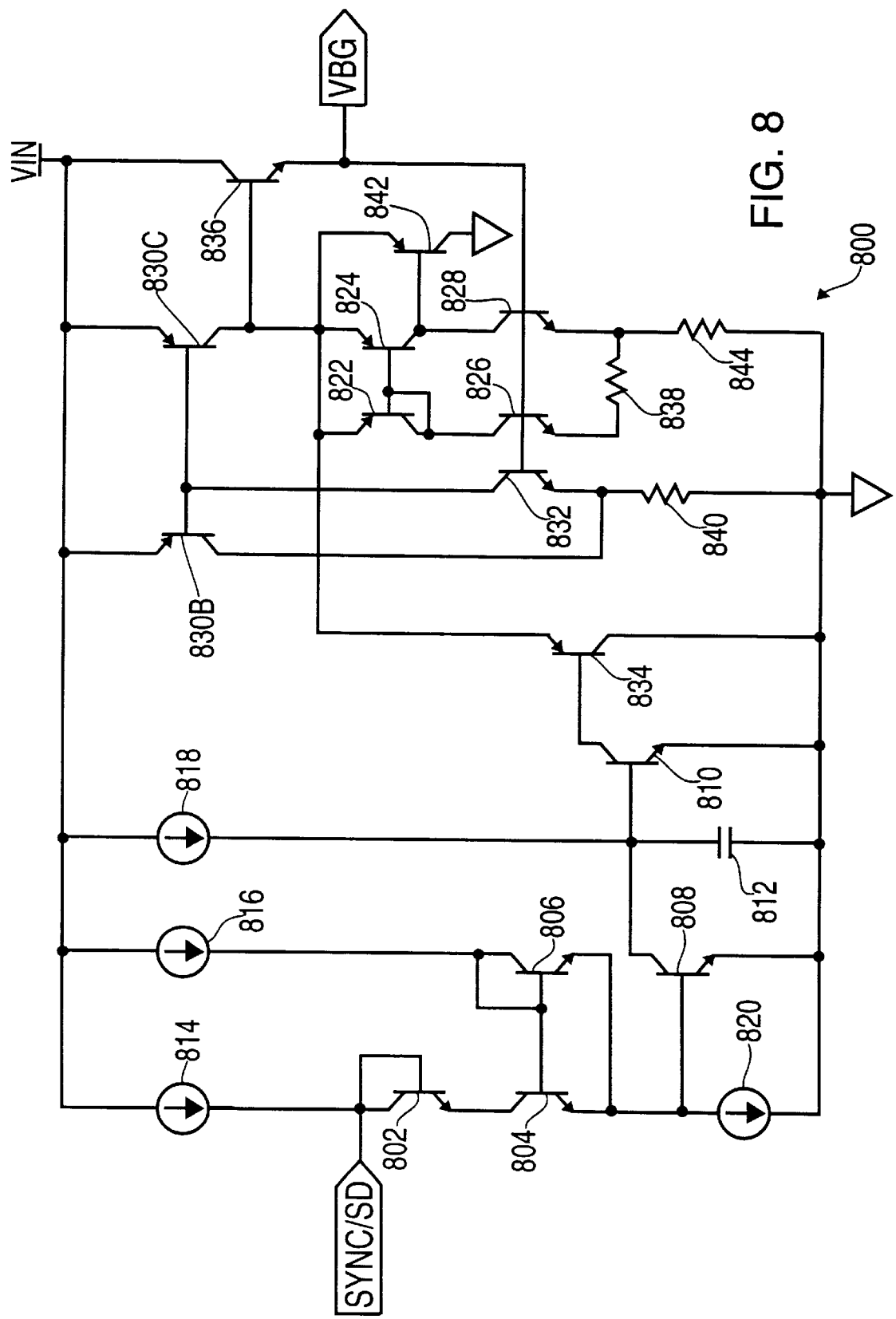
FIG. 8 is a schematic diagram of an exemplary shutdown circuit for shutting down the circuitry of FIG. 2.

Additional circuitry shown in FIGS. 5 and 8 is directed toward another aspect of the present invention in which a single input node performs a combined synchronization and shutdown function. FIG. 5 shows synchronization circuit 528 being coupled to oscillator 500. The SYNC/SD node may be an external pin that, when a synchronization signal is applied, forces the regulator to operate at a frequency different than the regulator's natural frequency. External synchronization may be used, for example, to synchronize multiple regulators operating in a single circuit.

When the SYNC/SD node is tied high or floats, the regulator circuit operates at its natural frequency because current source 540 ($I_6$) drives the base of transistor 532, keeping it turned on. While transistor 532 is on, it shunts current source 538 ($I_5$) so that transistor 530 remains off. Keeping transistor 530 turned off effectively isolates synchronization circuit 528 from the oscillator circuit. When a synchronization signal above the internal oscillator frequency is applied to the SYNC/SD node, it forces the oscillator to operate at the higher frequency. This occurs due to the charging and discharging of capacitor 536. The falling edge of the synchronization signal level shifts capacitor 536 so that the voltage at the base of transistor 532 drops. This causes transistor 532 to turn off, which in turn causes current source 538 to turn on transistor 530. When transistor 532 turns on, the reference signal from current source 504 ($I_2$) is shunted (through transistor 530) so that the oscillator is restarted (i.e., when the collector current on transistor 510 exceeds current $I_2$, the SET terminal goes high, turning on transistors 516 and 522, thus marking the start of the oscillator's fall time). While transistor 532 is off, current source 540 charges capacitor 536 until the voltage at the base of transistor 532 is high enough so that it turns back on, forming a re-triggerable one shot (and the cycle begins again). Additionally, to improve the synchronization characteristics of circuit 528, a diode connected transistor 534 is included for clamping the operational range of capacitor 536. In this manner, capacitor 536 is typically restricted to operate between $+V_{BE}$ and $-V_{BE}$.

Figure 10:
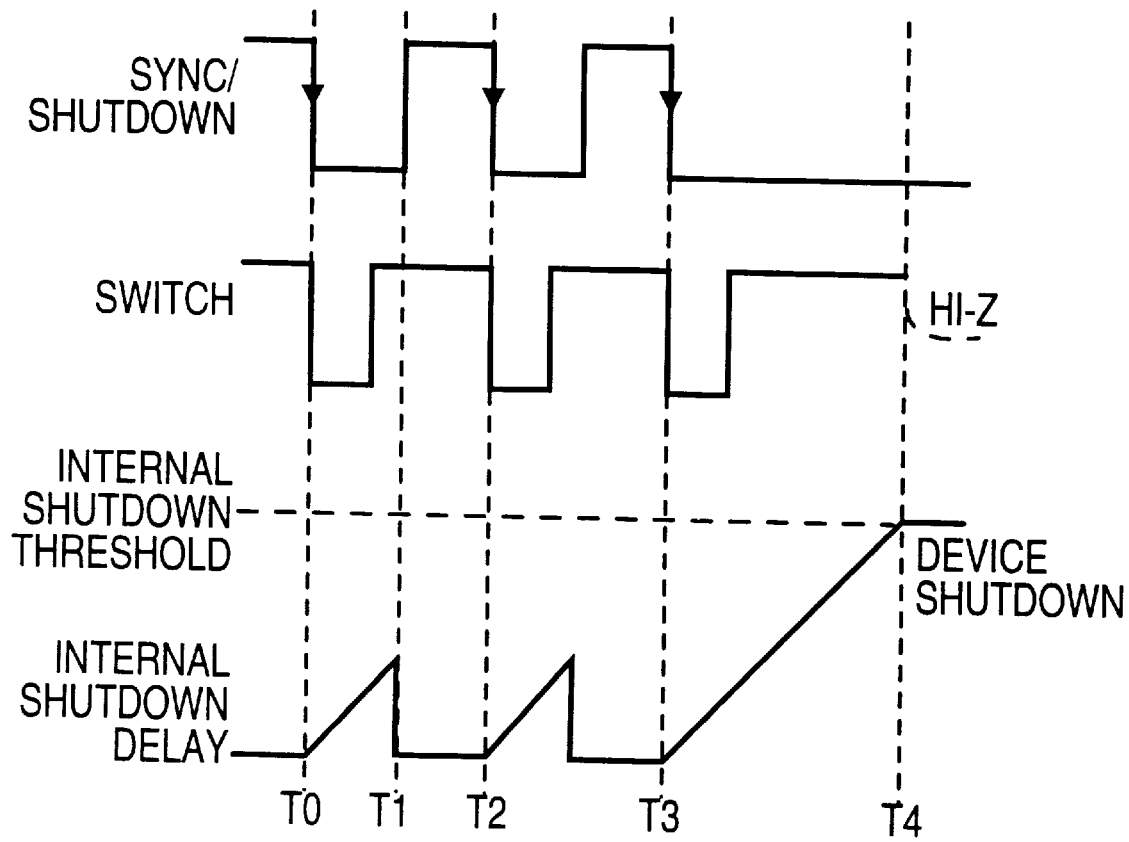
FIG. 10 is a graph showing relationship between the synchronization function and the shutdown function of the circuitry of FIGS. 5 and 8.

The SYNC/SD node going low causes multiple things to happen. In the circuitry of FIG. 5 (as previously described), the oscillator is synchronized. Additionally, this causes a shutdown signal to be applied to shutdown circuitry 800, as shown in FIG. 8. Current source 818 ($I_3$) provides an internal shutdown delay (see FIG. 10) which prevents instantaneous shutdown, while also permitting the synchronization circuitry to also use the SYNC/SD node. If transistor 808 is on, it shunts current source 818 and prevents capacitor 812 from charging. Transistors 804 and 806 form a current mirror such that their collectors attempt to draw current in a 5:1 ratio (note that the emitter area ratios are 5:1, respectively). Current source 816 ($I_2$) is set to supply 0.3 microamps through transistor 806, so 1.5 microamps should go through the emitter of transistor 804 (due to the described area ratios). Current source 814 ($I_1$) provides 1.2 microamps to transistors 802 and 804, as long as the SYNC/SD node is not tied to ground. Therefore, transistors 802, 804 and 806 are all on and approximately 1.8 microamps passes through the node formed by the emitters of transistors 804 and 806 (transistor 802 level shifts the threshold at which transistor 808 turns on and off depending on the status of the SYNC/SD node). This current is more than the current pulled by current source 820 ($I_4$) (for example, 0.6 microamps) so that transistor 808 is turned on.

A synchronization signal applied to the SYNC/SD node (as shown by the top trace on FIG. 10) causes the node to go to ground periodically, which shunts current source 814. This turns off transistors 802 and 804 so that only 0.3 microamps flows from the emitter node (i.e., the 0.3 microamps from source 816 through transistor 806). Because this current is not enough to overcome current source 820, transistor 808 turns off and capacitor 812 begins charging (see the bottom trace in FIG. 10, from time T0 to time T1). Once the synchronization signal rises, capacitor 812 is discharged and the cycle begins again. When the SYNC/SD node is tied to ground, transistor 808 remains off which permits capacitor 812 to charge up (see the bottom trace in FIG. 10 from time T3 to time T4) until transistor 810 is turned on and shutdown is accomplished.

Additional circuitry shown in FIG. 8 generates the bandgap reference voltage ($V_{BG}$) which is utilized by many of the circuits described herein. Therefore, all that needs to happen to shutdown the regulator circuit (placing it in a high impedance state to significantly reduce power consumption) is to shut down the bandgap generator. The bandgap generator is essentially formed by transistors 822, 824, 826 and 828 (transistors 822 and 824 form a current mirror). Transistors 826 and 828 are provided with an emitter area ratio of 10:1 so that a 60 millivolt differential is created between the emitters. This voltage is placed across resistor 838 to establish a current into resistor 844, which is selected to get the desired bandgap voltage (e.g., 1.24 volts). Transistor 830C drives the bandgap circuit. The current through the collector of transistor 830B (a voltage approximately equal to $V_{BG}$-transistor 832's $V_{BE}$ is generated across resistor 840 to create the current through transistor 830B) is mirrored through transistor 830C's collector, as long as the bandgap circuit is on (excess drive current from transistor 830C is shunted by transistor 842). When capacitor 812 is permitted to ramp all the way up (i.e., SYNC/SD stays low), transistor 810 is turned on and current is pulled through buffer transistor 834 so that the bandgap goes low. When the bandgap goes low, the emitter of transistor 832 goes low and current no longer flows through transistor 830B. Thus, the regulator circuit may be shutdown from the same node as the synchronization signal is applied.

Figure 9:
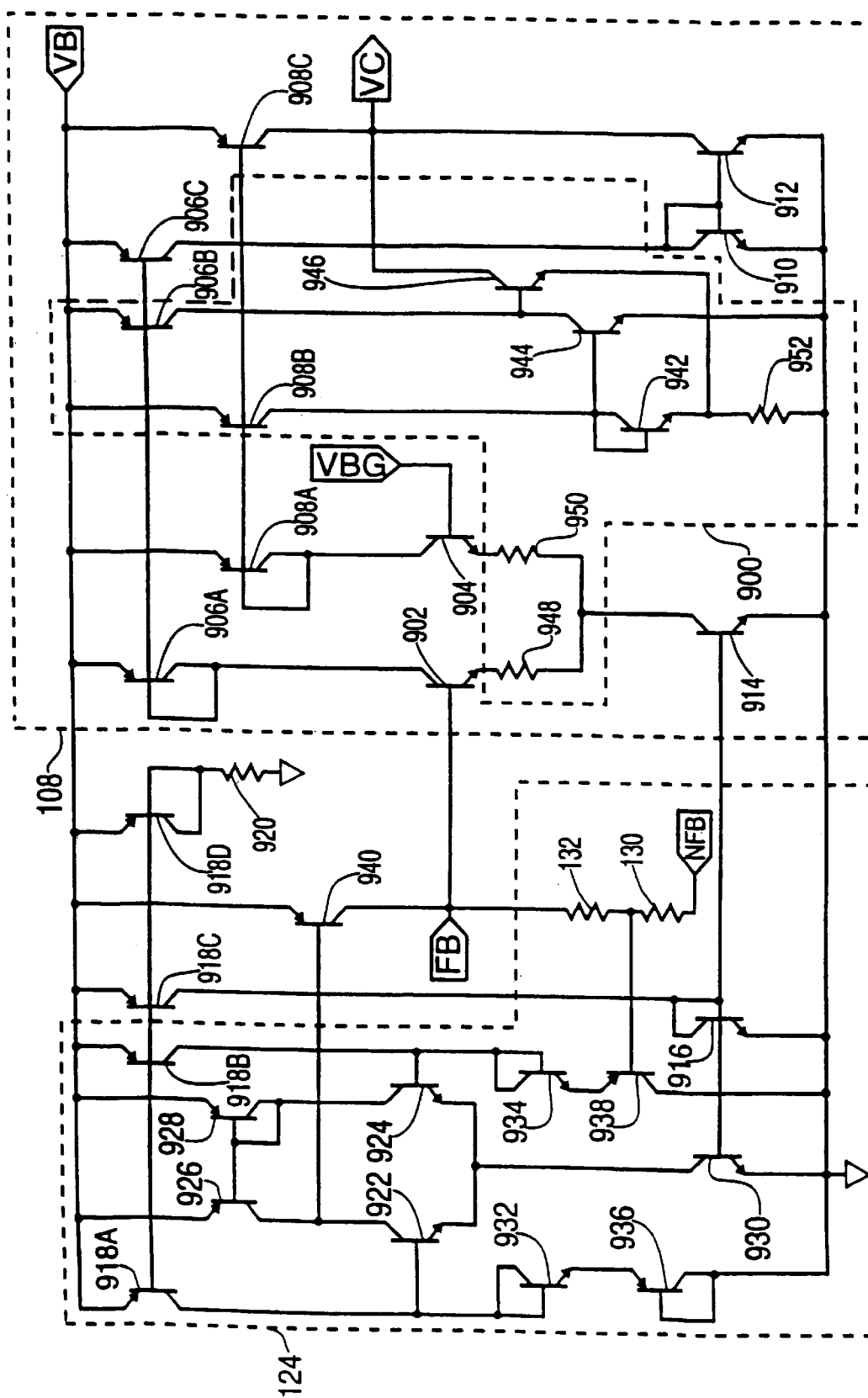
FIG. 9 is a schematic diagram of an exemplary error amplifier and negative feedback network of the circuitry of FIG. 1.

The present invention also includes circuitry which enables the regulator to regulate either a positive or negative voltage. In applications where dual polarity regulation is required, prior art circuits required several additional pins to accomplish all the desired functions and also required additional external components. The circuitry of the present invention utilizes only one additional pin and needs no external components. FIG. 9 shows a detailed schematic of error amplifier 108, including overshoot recovery circuit 900, and negative feedback network 124. Error amplifier 108 is formed by the differential pair of transistors 902 (the negative input) and 904 (the positive input, which is tied to $V_{BG}$). The error amplifier receives its current from a current source formed by resistor 920 and transistors 914, 916, 918C and 918D (resistor 920 and transistor 918D set the currents for the circuit shown in FIG. 9). Transistors 902 and 904 have their collectors coupled to transistors 906A and 908A (diode connected transistors) which have their bases coupled to transistors 906C and 908C. Transistor 906C is collector coupled to transistors 910 and 912 which form a current mirror, where the output of the amplifier is taken from the node between the collectors of transistors 908C and 912 ($V_C$). In this manner, any imbalance between FB and $V_{BG}$ is mirrored from transistors 902 and 904 through transistors 906A and 908A to the current mirror, so that the current in the collectors of transistors 908C and 912 will not be equal. The difference is fed via $V_C$ to comparator 112 which adjusts the current shut off point.

The negative feedback network includes differential amplifier transistors 922 and 924, current mirror transistors 926 and 928, current source transistor 930, level shift transistors 932 and 934, input transistors 936 (the positive input, tied to ground) and 938 (the negative input, tied to the node between resistors 130 and 132), and output transistor 940. As in error amplifier 108 discussed above, if the inputs to the amplifier are balanced, the currents from the collectors of transistors 922 and 926 will cancel each other so that there is little net current on the base of output transistor 940 (sufficient only to drive node FB to $V_{BG}$).

One of the advantages of the negative feedback network of the present invention is the fact that the regulator uses the same error amplifier to regulate positive and negative input voltages. The network circuitry is configured such that the negative feedback amplifier removes itself from the circuit when positive voltages are being regulated, without affecting the regulation. When positive voltages are regulated, the FB node is connected to a positive regulator network, which regulates FB to a reference voltage ($V_{REF}$), while the NFB node floats. $V_B$ (which is now equal to $V_{REF}$) is also provided to the negative input of the negative feedback amplifier, through resistor 132, causing the output of the negative amplifier to turn off and isolating the negative amplifier from the error amplifier. (The negative input has a positive voltage and the positive input is at ground, therefore the output tries to pull node FB down, but cannot do so because transistor 940 is a PNP (acting like diode 134 of FIG. 1). During negative voltage regulation, the FB node floats and the NFB node is connected to a negative regulator network which regulates NFB at $-2V_{REF}$. In this case, the negative feedback amplifier drives the FB node to about $V_{REF}$ (because transistor 940 is now turned on). Thus, positive and negative voltage regulation is accomplished using a common error amplifier which retains its multiple functions including oscillator frequency shifting, overshoot improvement and loop frequency compensation.

Another aspect of the present invention shown in FIG. 9 is overshoot recovery circuit 900 which limits overshoot that regulators typically experience, either during startup or following the release of an overload condition. Overshoot recovery circuit 900 includes transistors 906B and 908B (which have a common base with transistors 906A/906C and 908A/908C, respectively, current mirror transistors 942 and 944, control transistor 946, emitter degeneration resistors 948 and 950 and shunting resistor 952. The circuit operates as follows.

During normal conditions, the currents in the differential pair of error amplifier 108 (transistors 902 and 904) are mirrored to transistors 942 and 944 (as the currents were mirrored through transistors 906 and 908 to transistors 910 and 912 in the error amplifier). In a balanced error amplifier condition, transistors 942 and 944 are driven with equal currents, but because of their unequal emitter areas (the ratio between transistors 942 and 944 may be about 2:3) transistor 944 is pushed into saturation. This causes the collector of transistor 944 to be low and, therefore, transistor 946 is turned off. While transistor 946 is turned off, overshoot recovery circuit 900 is essentially disconnected from the error amplifier. When an overshoot condition occurs, either at startup or any other time, the current differential appearing on differential pair 902/904 causes transistor 944 to come out of saturation. Transistor 944's collector goes high and turns on transistor 946 which causes extra current to be pulled from the VC node (resistor 952 controls the amount of current that transistor 946 pulls from VC). The trip point at which the overshoot recovery circuit becomes active is set by resistors 948 and 950 and the emitter area ratios of transistors 942 and 944. One advantage of this technique over conventional techniques is that the point at which high negative slew currents on the VC node are permitted is moved away from the regulating point. For example, the trip point may be set to $V_{REF}$ plus 50 millivolts.

Another aspect of the present invention, for efficiently increasing the speed of operation of switch 114, is a circuit that decreases switch turn off time. In FIG. 2., this circuit includes a network comprising capacitor 258, resistor 222, diode-connected transistor 252, and diode 260. The circuit works as follows.

The speed with which transistor 114 turns off is related to its base discharge current. Generally, as the base discharge current of a transistor increases the speed at which the transistor turns off increases. The circuit including capacitor 258, resistor 222 and diode 260 takes advantage of this principle by momentarily boosting switch 114's base discharge current while the switch is transitioning from on to off, in order to increase the speed with which that transition occurs. Once the transistor has turned off, the boosting ceases. This is shown in FIG. 11, which plots against time the voltages on the collectors of transistors 254, 256 and 114 in relation to the base ($I_B$) and collector ($I_C$) currents of transistor 256 and the current through capacitor 258.

Figure 11:
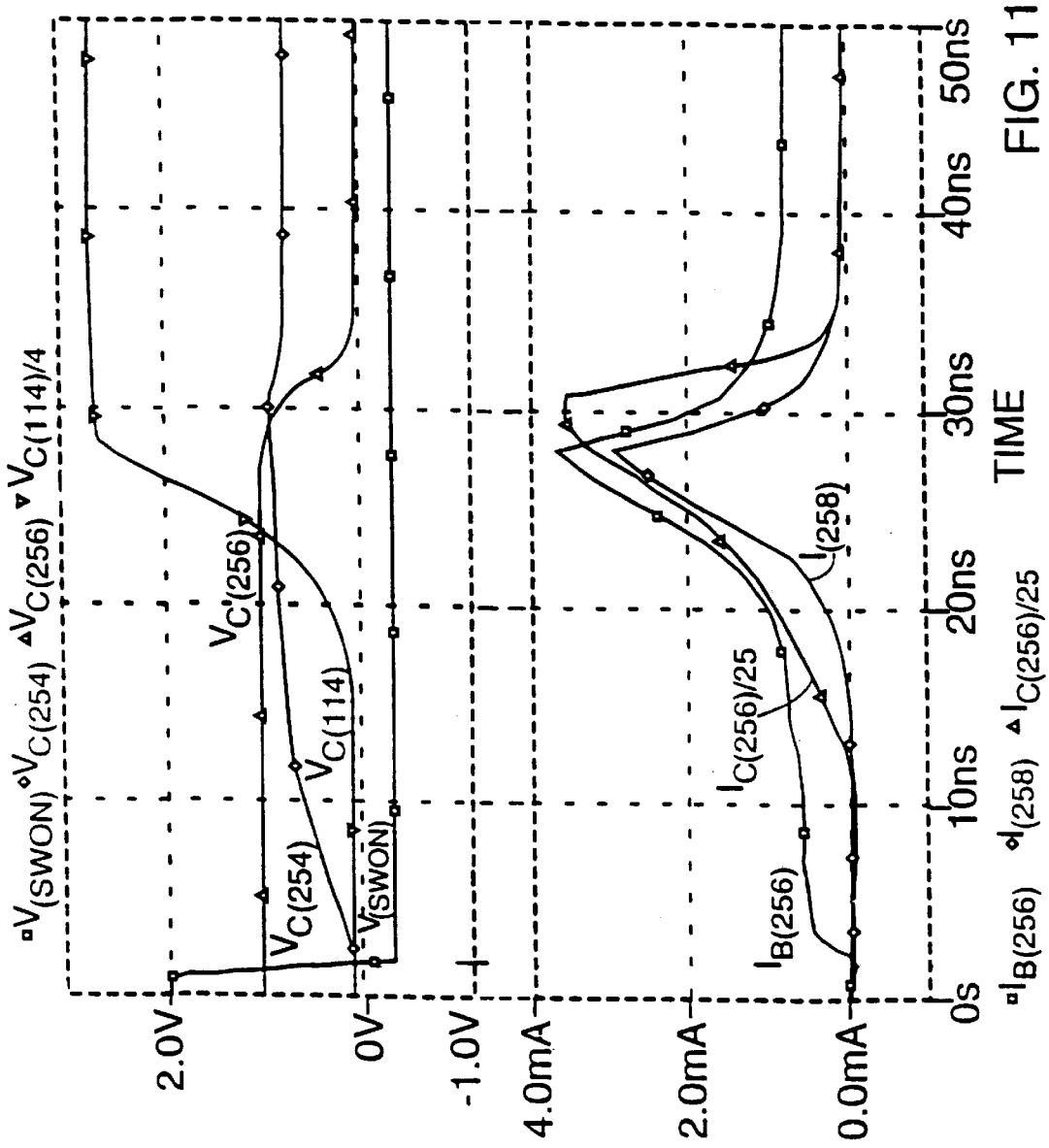
FIG. 11 is a graph showing the voltages on the collectors of transistors 254, 256 and 114 in FIG. 2 against time.

In FIG. 11 the process of turning switch 114 off commences when signal SWON transitions from high to low. When this happens, as the figure shows, transistor 254 and transistor 256 will turn on to provide a base discharge current for switch 114. The current that transistor 256's collector can remove from transistor 114's base is limited, however, by the amount of current that transistor 226D delivers to transistor 256's base. Capacitor 258, resistor 222 and diode 258 operate to augment this base current when switch 114's collector voltage begins to rise (which occurs when the switch begins its transition from on to off, as shown by the trace labelled $V_{CQ114}$ in FIG. 11). This additional current through capacitor 258 (see FIG. 11, trace $I_{258}$) increases transistor 256's collector current (FIG. 11, trace $I_{CQ256/25}$). to increase the base discharge current of switch 114. As transistor 114's collector continues rising, capacitor 258, resistor 222 and diode 260 continue to boost transistor 256's collector current. The result is that the time it takes switch 114 to turn off is reduced.

The boosted discharge current, fed through capacitor 258, is only required on an AC basis. It is also required only when switch 114 is being turned off (i.e., when switch 114's collector voltage is rising). Diode 260 is used, accordingly, to block current when switch 114 is being turned on. Resistor 222 limits the amount of the current boost. Diode-connected transistor 252, shown coupled between ground and the anode of diode 260, is provided to discharge capacitor 258 on each ON cycle of switch 114 to prevent the capacitor from peak detecting the collector voltage of the switch.

By boosting transistor 114's base discharge current only when required (i.e., while switch 114 is transitioning from on to off), the circuit of the present invention further increases switching speed without unnecessarily wasting power. Persons skilled in the art will recognize that the discharge current for transistor 114 could have been increased by increasing transistor 226D's collector current. However, permanently increasing this current wastes power because the boosted current is only needed for a short time.

Still another aspect of the present invention that increases the speed at which transistor 114 switches off and improves efficiency is an improved clamp for defining the switch voltage in the "on" state. It is well known that the speed at which a transistor can turn off while operating near or in saturation is related to how far in saturation the transistor is operating. A transistor operating out of saturation, or in quasi-saturation, will turn off more quickly than will a more saturated one. For this reason, it is well known to use a Baker clamp to prevent a switch from becoming too saturated. Examples of previously used Baker clamp circuits may be found in U.S. Pat. No. 4,755,741 (see FIG. 6); "Collector Diffusion Isolation—A new Bipolar Process for Integrated Circuits," Ferranti Ltd, 2nd Edition, October 1972; and Bob Mammano, "Simplifying Converter Design with a new Integrated Regulating Pulse Width Modulator," Vol. III of the Processdings of Powercon 3: Third National Solid-State Power Conversion Conference, June 1976.

However, traditional Baker clamps—because their operation relies on feedback—can cause instabilities in the circuit in the nature of ringing or oscillations. This ringing causes electromagnetic interference and may reduce efficiency of the regulator circuit.

An aspect of the present invention solves this problem in prior art Baker clamped switches by the circuitry shown in FIG. 2. The Baker clamp in FIG. 2 is comprised of PNP transistor 248 and diode-connected transistor 246. The base-emitter circuits of these components, when coupled as shown, form a loop with the base emitter circuit of transistor 250 and the base-collector circuit of transistor 114. The base-emitter voltages of transistors 246 and 248 are chosen (by area-ratioing) to limit the collector-emitter voltage of switch 114 in the on state. Transistors 246 and 248 become forward-biased—causing current to be shunted away from the base of transistor 250. Transistors 246 and 248 thus operate to limit the on state voltage of switch 114. When the collector-emitter voltage of switch 114 drops below a desired level, the feedback action of transistors 246 and 248 will cause the collector voltage of transistor 114 to drop just low enough to turn on both transistors 246 and 248. Hence, transistor 114's collector voltage is clamped, and the operating point of the switch is limited. This limiting function may be used, for example, to control the depth of saturation of the switch.

Figure 12:
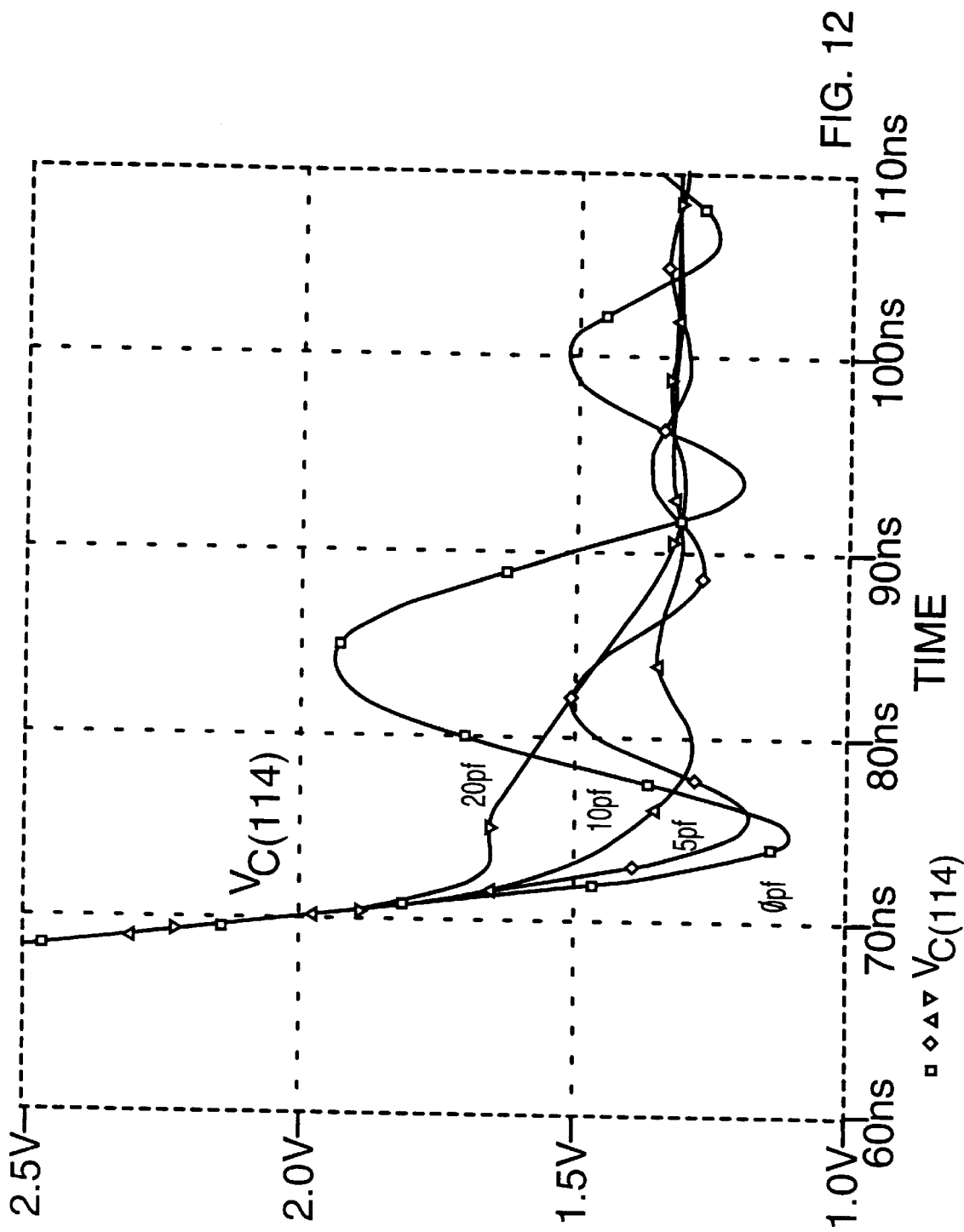
FIG. 12 is a graph plotting the voltage at the collector of the switch of FIG. 2 against time, and showing the increased stability of the switch clamp circuitry of the present invention.

A problem with the circuit of FIG. 2 to extent described so far is that, as mentioned, the Baker clamp is susceptible to instabilities. These instabilities are caused by delays in the feedback loop, a major cause of which is a significant delay associated with diode-connected transistor 246. The present invention solves this ringing problem by adding a capacitor, $C_F$, across diode-connected transistor 246 as shown in FIG. 2. The degree to which capacitor $C_F$ reduces ringing depends on the value chosen for the capacitor. FIG. 12 shows results that might be expected for different values of capacitor $C_F$ in the circuit of FIG. 1, but the effect of the capacitor in other circuits will vary based upon the selected operating region for the switch. For example, a slight improvement over the use of no capacitor at all results with a capacitance value of 5 pf (shown in FIG. 12 by the trace labelled "5 pf"). A value for capacitor $C_F$ of 10 pf provides a further improvement in stability as shown by the trace labelled "10 pf." On the other hand, a value of 20 pf for capacitor $C_F$ over-compensates the circuit, as shown in FIG. 12 by the trace labelled "20 pf." This over-compensation is undesirable, because it allows the switch to spend more time in a higher power state. The end result is that the switch, under certain conditions, switches more slowly, creating AC switching losses. In an actual embodiment of the circuit of FIG. 2, a value of about 15 pf for capacitor $C_F$ was found to give satisfactory results.

The circuits of FIGS. 1, 2, 3, 5, 6, 8 and 9 can be implemented using commercially available components. For example, the circuits can be constructed and operated using the components and values set forth in Table 1, below (for the transistors, only transistor type and area ratio are given):

TABLE 1

| | |
|---|---|
| Capacitor $C_F$: | 15 picofarads |
| Capacitor 526: | 22 picofarads |
| Capacitor 258: | 2 picofarads |
| Capacitor 536: | 1.5 picofarads |
| Capacitor 812: | 12 picofarads |
| Resistor 130: | 100K ohms |
| Resistor 132: | 50K ohms |
| Resistor 136: | 0.1 ohms |
| Resistor 202: | 25K ohms |
| Resistor 204: | 15K ohms |
| Resistor 206: | 30K ohms |
| Resistor 208: | 1.5K ohms |
| Resistors 210 and 844: | 5K ohms |
| Resistors 212, 216, 222 and 224: | 1K ohms |
| Resistor 214: | 4K ohms |
| Resistor 218: | 10 ohms |
| Resistor 220: | 10K ohms |
| Resistor 524: | 9.2K ohms |
| Resistor 838: | 1.2K ohms |
| Resistor 840: | 6K ohms |
| Resistor 920: | 28K ohms |
| Resistors 948 and 950: | 2K ohms |
| Resistor 952: | 20 ohms |
| Transistor 114: | NPN; 6000:1 |
| Transistors 226A, 232, 244, 822, 824, 842, 918D, 926, 928, 936, 938 and 940: | PNP; 1:1 |
| Transistor 226B: | PNP; 0.2: 1 |
| Transistor 226C: | PNP; 0.4:1 |
| Transistor 226D: | PNP; 1.6:1 |
| Transistors 226E and 520: | PNP; 5:1 |
| Transistors 228, 240, 510, 514, 914 and 942: | NPN; 2:1 |
| Transistors 230, 516, 530, 532, 534, 602, 802, 806, 808, 810, 828, 832, 902, 904, 916, 922, 924, 930, 932, 934 and 946: | NPN; 1:1 |
| Transistors 236, 238, 252, 518, 604, 606, 804, 836, 910 and 912: | NPN; 5:1 |
| Transistors 242, 254 and 826: | NPN; 10:1 |
| Transistor 246: | NPN; 30:1 |
| Transistor 248: | PNP; 20:1 |
| Transistor 250: | NPN; 180:1 |
| Transistor 256: | NPN; 120:1 |
| Transistors 522 and 608: | NPN; 2.5:1 |
| Transistor 830B: | PNP; 0.7:1 |
| Transistor 830C: | PNP; 1.5:1 |
| Transistors 834, 906C and 908C: | PNP; 2:1 |
| Transistors 906A, 906B, 908A, 908B and 918C: | PNP; 0.5:1 |

TABLE 1-continued

| | |
|---|---|
| Transistors 918A and 918B: | PNP; 0.1:1 |
| Transistor 944: | NPN; 3:1 |

While preferred embodiments of the invention have been set forth for purposes of the disclosure, modification of these embodiments may occur to those skilled in the art. For example, while the circuits of the present invention have been disclosed in the context of a control circuit for a switching regulator, it will of course be understood by those skilled in the art that the invention may be employed in any type of circuit utilizing switching transistors. Persons skilled in the art will appreciate that the present invention can be practiced by other than the described embodiments, which are presented for purposes of illustration and not of limitation, and that the present invention is limited only by the claims which follow.

What is claimed is:

1. A method for limiting an overshoot condition in a voltage regulator having an error amplifier and an overshoot recovery circuit, the overshoot recovery circuit including a control circuit, the method comprising:

setting a point at which the overshoot recovery circuit becomes active;

during a balanced condition of said error amplifier, shutting OFF said control circuit such that said overshoot recovery circuit is OFF; and during an overshoot condition of said error amplifier that occurs at said point, turning ON said control circuit such that said overshoot recovery circuit operates to limit an overshoot condition in said voltage regulator.

2. A voltage regulator circuit including an overshoot recovery circuit means and an error amplifier means, said overshoot recovery circuit including a control circuit means, the circuit comprising:

means for setting a point at which the overshoot recovery circuit becomes active;

during a balanced condition of said error amplifier means, means for shutting OFF said control circuit such that said overshoot recovery circuit is OFF; and during an overshoot condition of said error amplifier means that occurs at said point, turning ON said control circuit means such that said overshoot recovery circuit means operates to limit said overshoot condition.

3. An overshoot recovery circuit for use in a voltage regulator circuit having an error amplifier, the overshoot recovery circuit comprising:

a trip point set circuit that sets a point at which the overshoot recovery circuit becomes active; and a control circuit that turns the overshoot recovery circuit OFF during a balanced condition of said error amplifier, and that turns the overshoot recovery circuit ON during an overshoot condition of said error amplifier that occurs at said point.

* * * * *